US007701756B2

(12) United States Patent  
Aouba et al.

(10) Patent No.: US 7,701,756 B2  
(45) Date of Patent: Apr. 20, 2010

(54) MAGNETIC MEMORY COMPOSITION AND METHOD OF MANUFACTURE

(75) Inventors: Stephane Aouba, Toronto (CA); Harry Ruda, Toronto (CA)

(73) Assignee: Governing Council of the University of Toronto, Toronto (CA)

( * ) Notice: Subject to any disclaimer, the term of this patent is extended or adjusted under 35 U.S.C. 154(b) by 251 days.

(21) Appl. No.: 11/641,117

(22) Filed: Dec. 19, 2006

(65) Prior Publication Data

US 2007/0171695 A1 Jul. 26, 2007

Related U.S. Application Data

(60) Provisional application No. 60/752,035, filed on Dec. 21, 2005, provisional application No. 60/780,841, filed on Mar. 10, 2006.

(51) Int. Cl.
*G11C 11/00* (2006.01)

(52) U.S. Cl. ................... 365/158; 365/170; 365/97; 365/171; 365/192

(58) Field of Classification Search .................. 365/170, 365/48, 66, 80–85, 100, 148, 158, 171, 173, 365/225.5, 243.5; 257/421, E21.665; 438/3; 977/933–935

See application file for complete search history.

(56) References Cited

U.S. PATENT DOCUMENTS

| 3,131,381 | A | 4/1964 | Bradley, Jr. |
| 3,343,084 | A | 9/1967 | Gambale et al. |
| 3,418,643 | A | 12/1968 | Bradley, Jr. |
| 3,551,904 | A | 12/1970 | Tomaszewski et al. |
| 3,818,465 | A | 6/1974 | Wiegand |
| 3,908,194 | A | 9/1975 | Romankiw |
| 4,238,837 | A | 12/1980 | DeLuca et al. |
| 4,316,263 | A | 2/1982 | Doyle |
| 5,045,793 | A | 9/1991 | Rathke |
| 5,068,826 | A | 11/1991 | Matthews |
| 5,075,247 | A | 12/1991 | Matthews |

(Continued)

FOREIGN PATENT DOCUMENTS

EP 0910092 4/1999

(Continued)

OTHER PUBLICATIONS

Answers.com, *magnetic core memory:Information From Answers.com*, accessed at http://www.answers.com (accessed Jun. 29, 2005).

(Continued)

*Primary Examiner*—Richard Elms  
*Assistant Examiner*—Harry W Byrne  
(74) *Attorney, Agent, or Firm*—Morgan, Lewis & Bockius LLP

(57) ABSTRACT

A sensing device includes a sensor, a control unit, an input/output (I/O) interface, and a non-volatile magnetic memory device having one or more memory cells, each of the memory cells, wherein each memory cell of the non-volatile magnetic memory device includes a magnetic switch including a magnetic component and a write coil located proximate the magnetic component, the write coil coupled to receive a current sufficient to create a remnant magnetic polarity in the magnetic component, and a Hall sensor, positioned proximate the magnetic component, to detect the remnant magnetic polarity indicative of a stored data bit.

10 Claims, 16 Drawing Sheets

U.S. PATENT DOCUMENTS

| | | | |
|---|---|---|---|
| 5,150,338 A | 9/1992 | Birecki et al. | |
| 5,251,170 A | 10/1993 | Daughton et al. | |
| 5,289,410 A * | 2/1994 | Katti et al. | 365/170 |
| 5,295,097 A | 3/1994 | Lienau | |
| 5,329,480 A | 7/1994 | Wu et al. | |
| 5,420,819 A | 5/1995 | Pohm | |
| 5,424,236 A | 6/1995 | Daughton et al. | |
| 5,504,699 A | 4/1996 | Goller et al. | |
| 5,569,544 A | 10/1996 | Daughton | |
| 5,595,830 A | 1/1997 | Daughton | |
| 5,617,071 A | 4/1997 | Daughton | |
| 5,636,159 A | 6/1997 | Pohm | |
| 5,687,217 A | 11/1997 | Bliss et al. | |
| 5,729,137 A | 3/1998 | Daughton et al. | |
| 5,768,180 A | 6/1998 | Pohm | |
| 5,831,426 A | 11/1998 | Black, Jr. et al. | |
| 5,892,708 A | 4/1999 | Pohm | |
| 5,949,707 A | 9/1999 | Pohm et al. | |
| 5,966,322 A | 10/1999 | Pohm et al. | |
| 6,021,065 A | 2/2000 | Daughton et al. | |
| 6,072,382 A | 6/2000 | Daughton et al. | |
| 6,147,900 A | 11/2000 | Pohm | |
| 6,153,318 A | 11/2000 | Rothberg | |
| 6,168,860 B1 | 1/2001 | Daughton | |
| 6,169,689 B1 | 1/2001 | Naji | |
| 6,229,729 B1 | 5/2001 | Lienau | |
| 6,252,390 B1 | 6/2001 | Black, Jr. et al. | |
| 6,275,411 B1 | 8/2001 | Daughton et al. | |
| 6,279,406 B1 | 8/2001 | Li et al. | |
| 6,300,617 B1 | 10/2001 | Daughton et al. | |
| 6,340,886 B1 | 1/2002 | Daughton et al. | |
| 6,341,080 B1 | 1/2002 | Lienau et al. | |
| 6,349,053 B1 | 2/2002 | Daughton et al. | |
| 6,391,483 B1 | 5/2002 | Zhu et al. | |
| 6,404,191 B2 | 6/2002 | Daughton et al. | |
| 6,404,671 B1 | 6/2002 | Reohr et al. | |
| 6,413,659 B1 | 7/2002 | Rothberg | |
| 6,437,558 B2 | 8/2002 | Li et al. | |
| 6,462,541 B1 | 10/2002 | Wang et al. | |
| 6,483,741 B1 | 11/2002 | Iwasaki et al. | |
| 6,510,080 B1 | 1/2003 | Farrar | |
| 6,535,416 B1 | 3/2003 | Daughton et al. | |
| 6,538,921 B2 | 3/2003 | Daughton et al. | |
| 6,552,932 B1 | 4/2003 | Cernea | |
| 6,583,629 B1 | 6/2003 | Stokes et al. | |
| 6,657,431 B2 | 12/2003 | Xiao | |
| 6,657,888 B1 | 12/2003 | Doudin et al. | |
| 6,674,664 B2 | 1/2004 | Pohm | |
| 6,711,053 B1 | 3/2004 | Tang | |
| 6,713,195 B2 | 3/2004 | Wang et al. | |
| 6,714,445 B2 | 3/2004 | Farrar | |
| 6,724,652 B2 | 4/2004 | Deak | |
| 6,743,639 B1 | 6/2004 | Tondra et al. | |
| 6,744,086 B2 | 6/2004 | Daughton et al. | |
| 6,751,147 B1 | 6/2004 | Smith et al. | |
| 6,774,391 B1 | 8/2004 | Cowburn | |
| 6,777,730 B2 | 8/2004 | Daughton et al. | |
| 6,791,792 B2 * | 9/2004 | Takahashi | 360/112 |
| 6,795,340 B2 | 9/2004 | Sakimura et al. | |
| 6,809,515 B1 | 10/2004 | Li et al. | |
| 6,809,516 B1 | 10/2004 | Li et al. | |
| 6,826,086 B1 | 11/2004 | Smith et al. | |
| 6,833,278 B2 | 12/2004 | Deak | |
| 6,836,137 B2 | 12/2004 | Hartmann | |
| 6,839,273 B2 | 1/2005 | Odagawa et al. | |
| 6,872,467 B2 | 3/2005 | Qian et al. | |
| 6,875,621 B2 | 4/2005 | Tondra | |
| 6,894,920 B2 | 5/2005 | Kim et al. | |
| 6,920,064 B2 | 7/2005 | Zhu et al. | |
| 6,985,383 B2 | 1/2006 | Tang et al. | |
| 6,987,692 B2 | 1/2006 | Smith et al. | |
| 7,027,319 B2 | 4/2006 | Anthony et al. | |
| 7,039,443 B2 | 5/2006 | Opela et al. | |
| 7,238,541 B2 | 7/2007 | Berndt et al. | |
| 7,376,007 B2 | 5/2008 | Stephenson et al. | |
| 2001/0017543 A1 | 8/2001 | Daughton et al. | |
| 2002/0060567 A1 | 5/2002 | Tondra | |
| 2002/0146580 A1 | 10/2002 | Wang et al. | |
| 2002/0171100 A1 | 11/2002 | Pohm | |
| 2003/0007395 A1 | 1/2003 | Stephenson et al. | |
| 2003/0007398 A1 | 1/2003 | Daughton et al. | |
| 2003/0048676 A1 | 3/2003 | Daughton et al. | |
| 2004/0013880 A1 | 1/2004 | Daughton et al. | |
| 2004/0023065 A1 | 2/2004 | Daughton et al. | |
| 2004/0042258 A1 | 3/2004 | Witcraft et al. | |
| 2004/0115478 A1 | 6/2004 | Qian et al. | |
| 2004/0125673 A1 | 7/2004 | Daughton et al. | |
| 2004/0137275 A1 | 7/2004 | Jander et al. | |
| 2004/0202018 A1 | 10/2004 | Witcraft et al. | |
| 2004/0259271 A1 | 12/2004 | Tondra | |
| 2005/0002267 A1 | 1/2005 | Daughton et al. | |
| 2005/0127916 A1 | 6/2005 | Tondra | |
| 2006/0164077 A1 * | 7/2006 | Mehnert et al. | 324/207.23 |

FOREIGN PATENT DOCUMENTS

| | | |
|---|---|---|
| EP | 1 028 474 A2 | 8/2000 |
| JP | 2003-022428 A | 1/2003 |
| JP | 2003-142752 A1 | 5/2003 |
| WO | 95/03899 A1 | 2/1994 |
| WO | WO 02/33705 | 4/2002 |

OTHER PUBLICATIONS

Answers.com, *MRAM:Information From Answers.com*, accessed at http://www.answers.com (accessed Jun. 29, 2005).

Answers.com, *thin film memory: Information From Answers.com*, accessed at http://www.answers.com (accessed Jun. 29, 2005).

Freescale Semiconductor, Inc., Data Sheet: *256K×16-Bit 3.3-V Asynchronous Magnetoresistive RAM*, Doc. No. MR2A16A, Revision 3 (rev. Jun. 19, 2006).

Freescale Semiconductor, Inc., *Magnetoresistive Random Access Memory* (rev. Jun. 23, 2006).

Honeywell International, Inc., *HXNV0100 64K×16 Non-Volatile Magnetic RAM* (May 2005), accessed at http://www.ssec.honeywell.com/aerospace/datasheets.html (accessed Feb. 7, 2006).

NRL Press Release, *Two NRL Research Physicists Named APS Fellows*, 21-04w, at http://www.nrl.navy.mil/pao/pressRelease.php?Y=2004&R=21-04w (accessed Feb. 7, 2006).

The Naval Research Laboratory: 75 Years of Materials Innovation, *Magnetic Materials and Semiconductor Technology*, accessed at http://72.14.207.104/search?q=cache:stZ70uDaMwUJ:www.tms.org (accessed Feb. 7, 2006).

Wired 8.04: Instant Access Memory, *While rivals work on "universal memory," Parking, armed with IBM's patents and one-of-a-kind tools, keeps humming along toward his instant-on PC.*, accessed at http://72.14.207.104/search?q=cache:2kEe7RcTXWYJ:www.wired.com (accessed Feb. 7, 2006).

James Daughton, Magnetoresistive Random Access Memory (MRAM), Feb. 4, 2000, pp. 1-13.

Pratyush Das Kanungo et al., Gated hybrid Hall effect device on silicon, Microelectronics Journal, 2005, pp. 294-297, vol. 36, Elsevier.

* cited by examiner

MAGNETIC MEMORY COMPOSITION AND METHOD OF MANUFACTURE

The present invention claims the benefit of U.S. Provisional Patent Application No. 60/752,035 filed Dec. 21, 2005 and No. 60/780,841 filed Mar. 10, 2006, all of which are incorporated herein by reference.

BACKGROUND OF THE INVENTION

1. Field of the Invention

The present invention relates to a memory device, and more particularly, to a memory device using magnetic memory elements.

2. Discussion of the Related Art

The rapid growth in the portable consumer product market (including the products for portable computing and communications) is driving the need for low power consumption non-volatile memory devices, with their inherent ability to retain stored information without power.

The principal technology currently available in the marketplace for these applications is EEPROM (Electrically Eraseable Programmable Read-Only Memory) technology, relying on charging (writing) or discharging (erasing) the floating-gate of a Metal-Oxide-Semiconductor (N-type) type transistor using so-called Fowler-Nordheim tunneling through the ultra-thin oxide layer of these structures. The charging of the gate creates results in an electron inversion channel in the device rendering it conductive (constituting a memory state 1). Discharging the floating gate (i.e., applying a negative bias) removes the electron from the channel and returns the device to its initial non-conductive state (i.e., memory state 0). One serious limitation to this technology is related to tunneling that limits the erase/write cycle endurance and can induce catastrophic breakdown (after a maximum of about $10^6$ cycles). Moreover, the required charging time—which is of the order of 1 ms—is relatively long.

In order to improve performance, so-called FeRAM (Ferroelectric Random Access Memory) technology has been developed. The FeRAM memory cell consists of a bi-stable capacitor, and is comprised of a ferroelectric thin film that contains polarizable electric dipoles. These dipoles, analogous to the magnetic moments in a ferroemagnetic material, respond to an applied electric field to create a net polarization in the direction of the applied field. A hysteresis loop for sweeping the applied field from positive to negative field defines the characteristics of the material. On removing the applied field, the ferroelectric material can retain a polarization known as the remnant polarization, serving as the basis for storing information in a non-volatile fashion. FeRAM would appear to be a promising technology with good future potential since relatively low voltages (typically about 5V) are required for switching as compared with about 12 to 15V for EEPROM. Moreover, FeRAM devices show $10^8$ to $10^{10}$ cycle write endurance compared with about $10^6$ for EEPROM, and the switching of the electrical polarization requires as little as about 100 ns compared with about 1 ms for charging an EEPROM. However, the need for an additional cycle to return a given bit to its original state for reading purposes aggravates the problems of dielectric fatigue. This, in turn, is characterized by degradation in the ability to polarize the material. In addition, owing to the behavior of these materials about their Curie temperature, as well as compositional stability (and associated changes in Curie temperature), even moderate thermal cycling promotes accelerated fatigue. Finally, fabrication process uniformity and control still remains a challenge.

Today, MRAM (Magnetoresistance Random Access Memory)—whose development began some 20 years ago—appears to hold the greatest promise for existing technologies in terms of read/write endurance cycle and speed. The technology relies on a writing process that uses the hysteresis loop of a ferromagnetic strip, while the reading process involves the anisotropic magnetoresistance effect. Basically, this effect (based on spin-orbit interaction) relates to the variation of the resistance of a magnetic conductor, dependent on an external applied magnetic field. The bit consists of a strip of two ferromagnetic films (e.g., NiFe) sandwiching a poor conductor (e.g., TaN), placed underneath an orthogonal conductive strip line (i.e., known as the word line). For writing, a current passes through the sandwich strip and when aided by a current in the orthogonal strip-line, the uppermost ferromagnetic layer of the sandwich strip is magnetized either clockwise, or counterclockwise. Reading is performed by measuring the magneto-resistance of the sandwich structure (i.e., by passing a current). Magneto-resistance ratios of only about 0.5% are typical, but have allowed the fabrication of a 16 Kb MRAM chip operating with write times of 100 ns (and read times of 250 ns). A 250 Kb chip was also later produced by Honeywell.

The discovery of so-called Giant Magneto-resistance (GMR) in 1989, implemented by sandwiching a copper layer with a magnetic thin film permitted further improvement in memory device performance. The GMR structures showed a magneto-resistance of about 6%, but the exchange between the magnetic layers limited how quickly the magnetization could change direction. Moreover magnetization curling from the edge of the strip imposed a limitation on the reduction in the cell size, or scaling.

Promising results were then obtained with the so called Pseudo-Spin Valve (PSV) cell made of a sandwich structure with two magnetic layers mismatched so that one layer tends to switch magnetization at a lower field than the other. The soft film is used to sense (by the magnetoresistance effect) the magnetization of the hard film—this latter film constitutes the storage media, having magnetization of either up or down (i.e., states 0 or 1). PSV structures are amenable to scaling but the reported fields required to switch the hard magnetic layer are still too high for high density integrated circuits. These devices appear to potentially represent a replacement for EEPROMs.

Further improvements in magnetoresistance (i.e., up to 40%) are obtained with spin-dependent tunneling devices (SDT). These devices are made of an insulating layer (i.e., the tunneling barrier) sandwiched between two magnetic layers. Device operation relies on the fact that the tunneling resistance, in the direction perpendicular to the stack, depends on the magnetization of the magnetic layers. The highest resistance is obtained when the magnetization of the layers is anti-parallel, and the parallel case provides the lowest resistance. The variation of spin (i.e., up or down) state density between the two magnetic layers explains this behavior. One of the layers is pinned while the second magnetic layer is free and used as the information storage media. SDT show promise for high performance non-volatile applications. Indeed there have been some reported values for write times as small as 14 ns with this approach. However, controlling the resistance uniformity (i.e., the tunneling barrier thickness and quality), and hence controlling the switching behavior from bit to bit remains a real challenge that has yet to be overcome in practical implementation. What is needed is a non-volatile memory device that is fast, reliable, relatively simple in design, inexpensive, and robust.

SUMMARY OF THE INVENTION

Accordingly, the present invention is directed to a magnetic memory device that substantially obviates one or more of the problems due to limitations and disadvantages of the related art.

An object of the present invention is to provide a magnetic switch used to form a memory cell in a non-volatile magnetic memory device.

Another object of the present invention is to provide a simplified method of fabricating a non-volatile magnetic memory device.

Additional features and advantages of the invention will be set forth in the description that follows and, in part, will be apparent from the description, or may be learned by practice of the invention. The objectives and other advantages of the invention will be realized and attained by the structure particularly pointed out in the written description and claims herein as well as the appended drawings.

To achieve these and other advantages and in accordance with the purpose of the present invention, as embodied and broadly described, a sensing device includes a sensor, a control unit, an input/output (I/O) interface, and a non-volatile magnetic memory device having one or more memory cells, each of the memory cells, wherein each memory cell of the non-volatile magnetic memory device includes a magnetic switch including a magnetic component and a write coil located proximate the magnetic component, the write coil coupled to receive a current sufficient to create a remnant magnetic polarity in the magnetic component, and a Hall sensor, positioned proximate the magnetic component, to detect the remnant magnetic polarity indicative of a stored data bit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
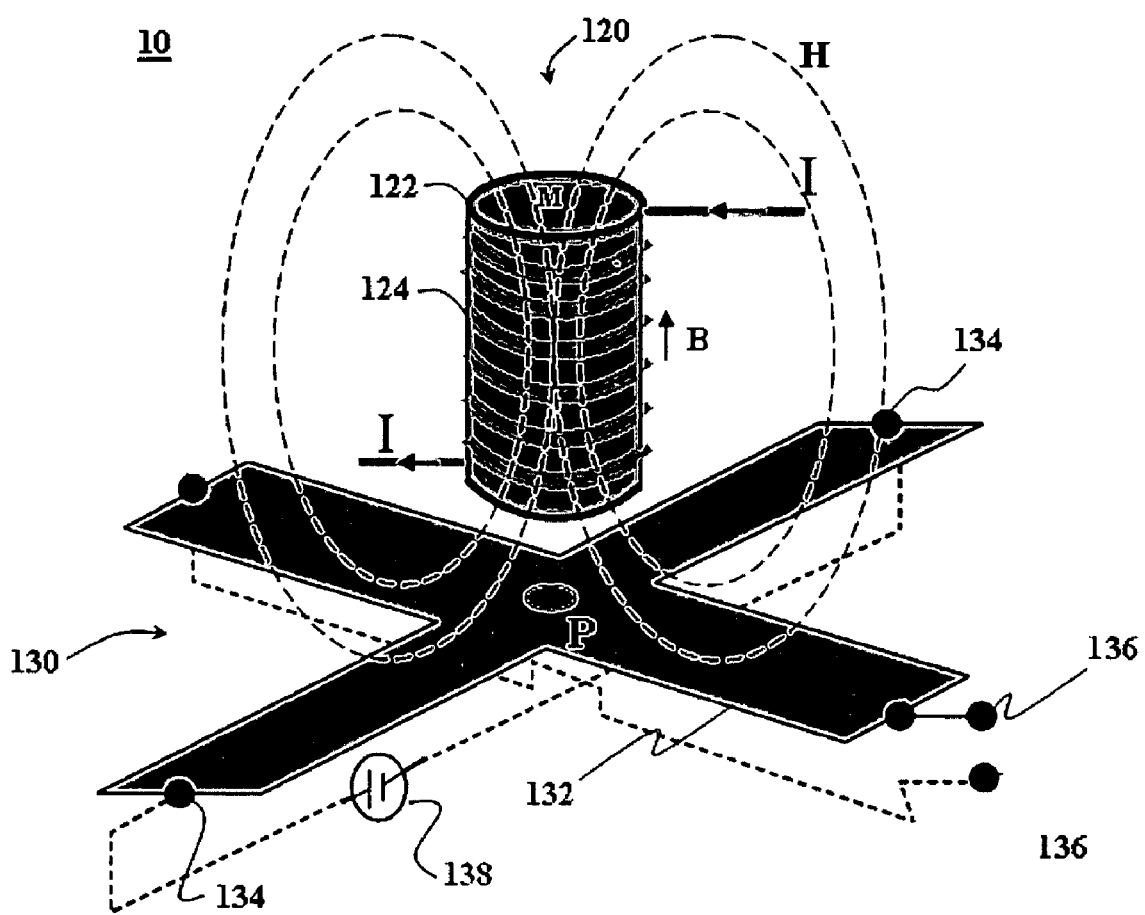
FIG. 1 shows a plan view of an exemplary embodiment of a memory cell in accordance with the present invention.

The present invention is directed to a magnetic memory device. In particular, FIG. 1 illustrates an exemplary embodiment of a memory cell of a magnetic memory device according to the present invention. Memory cell 10 according to an exemplary embodiment of the present invention includes a magnetic switch 120 and a sensor 130. The magnetic switch 120 includes a magnetic component or material 122 and coil 124 to hold data. The sensor 130 includes a Hall Effect sensor 132 and output terminals 136 connected to a voltage detector (not shown) to detect the stored data in magnetic switch 120.

In particular, the magnetic switch 120 includes a magnetic component 122. The magnetic component 122 may be a permanent magnet or a ferromagnetic material (e.g., nickel or nickel-iron magnet). A coaxial coil 124 (connected to a current source, not shown) is disposed about the magnetic component 122. The coaxial coil 124 is made of a conductive material, such as the metal Ti/Au. However, any other suitable conductive material (e.g., Ti/Cu/Ti) may be used without departing from the scope of the present invention. Although magnetic component 122 is shown as having a generally cylindrical shape for purposes of illustration, any suitable shape (e.g., square, rectangle, horseshoe) may be used without departing from the scope of the present invention. Furthermore, coaxial coil 124 is shown for purposes of illustration as having six (6) turns around magnetic component 122. However, any suitable number of turns may be used without departing from the scope of the present invention.

The Hall Effect sensor 132 includes a geometrically defined semiconductor structure with input terminals 134 connected to power supply 138 and output terminals 136 positioned perpendicularly to the direction of current flow. Although the Hall Effect sensor 132 is shown as having a "Greek cross" shape for purposes of illustration, any suitable shape (e.g., rectangle) may be used without departing from the scope of the present invention.

In general, the Hall Effect sensor responds to a physical quantity to be sensed (i.e., magnetic induction) through an input interface and, in turn, outputs the sensed signal to an output interface that converts the electrical signal from the Hall Effect sensor into a designated indicator. In the present case, when the Hall Effect sensor 132 is subjected to a magnetic field (H) from a magnetic component 122, a potential difference appears across the output terminals 136 in proportion to the field strength. When the Hall Effect sensor 132 is subjected to an equal and opposite magnetic field, an equal and opposite potential difference appears across the same output terminals 136. The Hall Effect sensor 132 thus acts as a sensor of both the magnitude and direction of an externally applied magnetic field.

In general, the shape and material used for magnetic switch 120 determines the strength of magnetization (M) responsible for generating a magnetic field (H) around sensor 130. The number of turns of the coil 124 around magnetic component 122, in conjunction with the current (I) applied to the coil 124, determines the strength of the induced magnetization (H) generated around magnetic component 122 to set the direction and intensity of the magnetization (M). The direction of the magnetization (M) of magnetic component 122 determines the value of the magnetic stored data (i.e., "0" or "1") in magnetic switch 120. The Hall Effect sensor 132 is characterized by voltage signal $V_{Hall}$ that is generated in response to the magnetic field (H) emanating from magnetic switch 120 detected at point P.

A current (I) (e.g., current pulse) is sent through the coil 124 in such a way as to generate a magnetic field $H_{coil}$. The magnitude of the current is chosen to be sufficient to change (i.e., flip) the magnetization of the magnetic component 122. The magnetic field generated by the magnetic component 122 needs to be sufficient for the sensor 130 to detect it at detection point P. After detection, sensor 130 needs to generate a response ($V_{Hall}$) greater than an offset voltage signal $V_{Off}$. An offset voltage $V_{off}$ is the threshold that must be overcome before any useful signals are generated. More specifically, the magnetic field (H) generated by the magnetization (M) of magnetic switch 120 must be strong enough at point P to generate an induced voltage in sensor 130 greater than $V_{Off}$ before the stored data can be accurately detected. A magnetic field that generates a voltage signal less than the offset voltage cannot be detected by the sensor 130 in the present DC bias conditions.

Figure 2A:
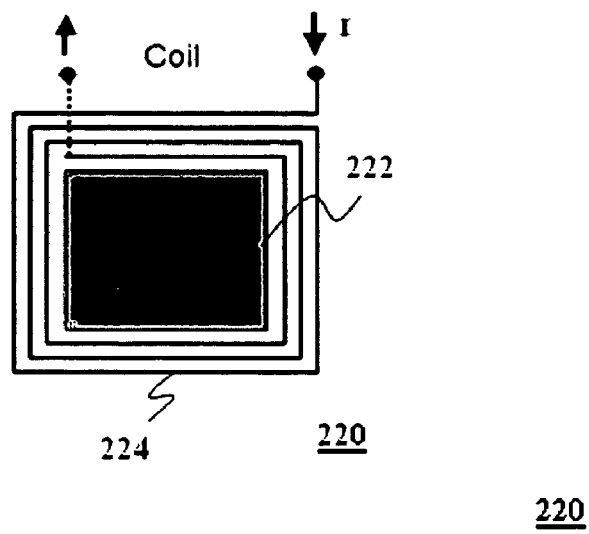
FIG. 2A shows a top view of an exemplary embodiment of a magnetic switch in accordance with the present invention.
Figure 2B:
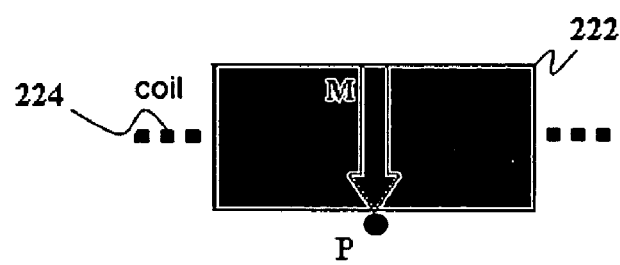
FIGS. 2B-2C show a side view of the exemplary embodiment of the magnetic switch shown in FIG. 2A.
Figure 2C:
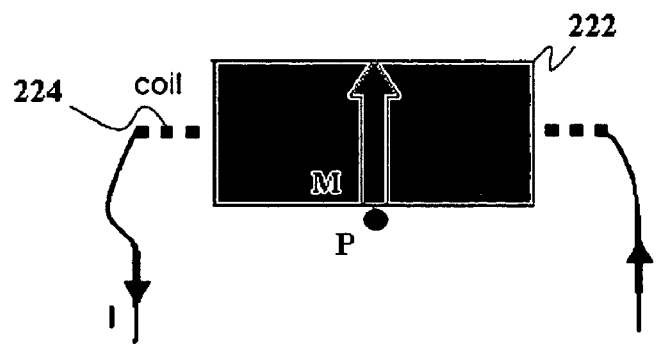

FIG. 2A shows a top view of an exemplary embodiment of a magnetic component surrounded by a coil. For purposes of illustration only, FIG. 2B shows a side view of a magnetic component 222 having an initial direction of magnetization (M) oriented downward. FIG. 2C shows that after a sufficiently high current (I) is sent through the coil 224, the magnetic component 222 retains an induced magnetization whose direction is oriented upward. In this case, the magnetic induction proximate to the surface of the magnetic component 222, at detection point P, is the field generated by the magnetic component 222. This field causes the sensor 130 to generate a voltage signal that should have a magnitude greater than the voltage signal $V_{Off}$ and a sign indicating the direction of magnetization (e.g., a positive voltage for "upward"). If an upward magnetization is designated as "1," then the sensor 130 detects the stored data as being "1."

To then attain a downward magnetization (i.e., "0"), a suitable current (e.g., current pulse in the opposite direction) is again sent through the coil 224 to generate a magnetic field $-H_{coil}$ (i.e., with the opposite orientation than $H_{coil}$) sufficient to change (i.e., flip) the magnetization of the magnetic component 222. After the pulse, the magnetic component 222 retains a magnetization that may have smaller magnitude or whose direction is oriented downward. In this case, the magnetic field at detection point P is the magnetic field generated by the magnetic component 222. The detected induction at point P causes the sensor 130 to generate a voltage signal that has a smaller magnitude or opposite sign indicating the direction of magnetization (e.g., a negative voltage for "downward"). If a downward or smaller magnetization is designated as "0," then the sensor 130 detects the stored data as being "0."

In another embodiment of the invention, a tunable magnetic switch according to the present invention ensures operational reliability of the fabricated magnetic memory device. In particular, the offset voltage threshold $V_{off}$ as discussed above may be larger than expected. The offset of the sensor are caused by such things as non-uniformity of the device and misalignments that occur during fabrication. The magnetic induction (B) generated by the magnetization (M) of magnetic switch 120 must be strong enough at point P to generate an induced voltage in sensor 130 before the stored data can be accurately detected. Once the memory device containing an array of memory cells 10 is fabricated, the internal components cannot be rearranged to reduce the operating offset threshold $V_{off}$. To address this problem, a tunable magnetic switch according to the present invention ensures operational reliability of the fabricated magnetic memory device by allowing the detected magnetic field to be tuned after the fabrication process, as presented below.

Figure 3A:
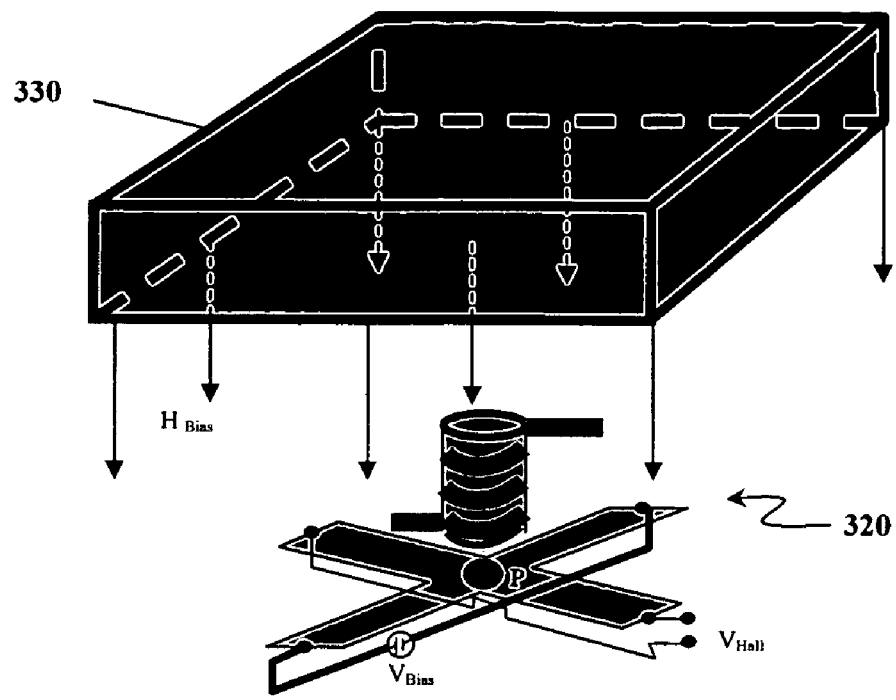
FIGS. 3A-3B show conceptual views of an exemplary embodiment of a tunable magnetic switch in accordance with the present invention.
Figure 3B:
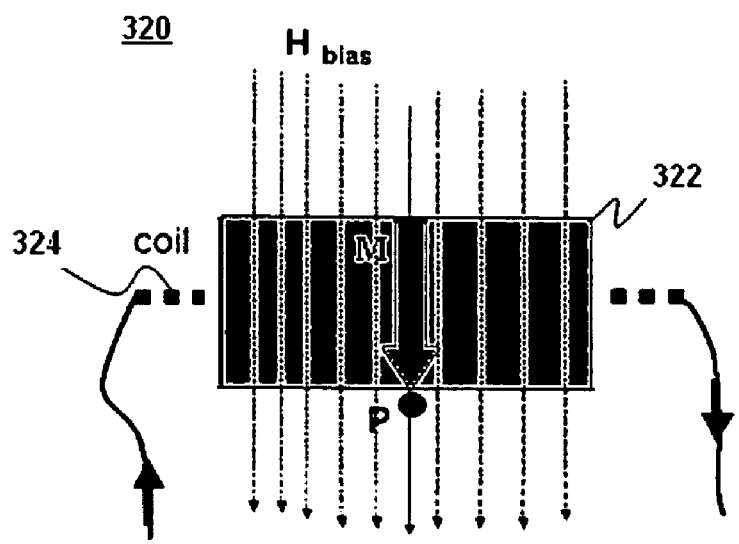

FIGS. 3A and 3B illustrate an exemplary embodiment of a tunable magnetic switch according to the present invention. For purposes of illustration, FIG. 3A shows a tunable magnetic switch 320 including two magnetic component 322 and 330. The magnetic component 322 is coupled to a three (3) turn coil. However, any suitable number of turns may be used without departing from the scope of the present invention. The magnetic component 322 may be a soft cylindrical bar magnet made of ferromagnetic material (e.g., nickel-iron magnet). The magnetic component 330 may be a hard permanent magnet made of ferromagnetic material (e.g., nickel, cobalt, and other related alloy magnets). Although magnetic components 322 and 330 are shown as having a particular shape for purposes of illustration, any suitable shape may be used without departing from the scope of the present invention.

As shown in FIG. 3B (i.e., side view), magnetic switch 320 is exposed to an external magnetic bias field $H_{bias}$ provided by the magnetic component 330. Once a biasing field $H_{bias}$ is established over magnetic switch 320, a current (I) (e.g., current pulse) is sent through the coil in such a way as to generate a magnetic field (H) having the same direction and orientation as the bias field $H_{bias}$. The magnitude of the current pulse is chosen to be sufficient to drive magnetic component 322 to its saturation magnetization value.

For purposes of illustration only, the direction of magnetization (M) of the magnetic component 322 is shown as initially being oriented downward, in the same direction as the constant bias field $H_{bias}$. After the current (I) is sent through the coil 324, the magnetic component 322 retains a high magnetization. In this case, the magnetic field proximate to the surface of the magnetic component 322, at detection point P, is the combination of the bias field $H_{bias}$ and the field generated by the magnetic component 322. This combined field results in a very high magnetization state, generating a voltage signal much greater than the offset voltage $V_{off}$. Hence, the sensor 130 easily detects the stored data as being "1," for example, assuming that the downward direction of magnetization (M) is designated as a high state (i.e., "1").

To attain a low state (i.e., "0"), a suitable current (I) (i.e., current pulse) is sent through the coil 324 to generate a magnetic field $-H_{coil}$ in the opposite direction to the bias field $H_{bias}$ sufficient to generate a total magnetic field (i.e., $H_{coil} + H_{bias}$) that demagnetizes the magnetic component 322. After the current is sent through the coil 324, the magnetization (M) will recoil following the recoil line, explained further below in reference to FIG. 4, providing a magnetic component 322 with a very low magnetization. If the current is strong enough, the magnetization (M) may even be oriented in the opposite direction. In this case, the magnetic field at detection point P will be that of the bias field $H_{bias}$ combined with the magnetic field generated by the magnetic component 322, which is either very low or in the opposite direction of the bias field $H_{bias}$. In either instance, the total magnetic induction at point P will be significantly lower than that corresponding to the high level case, non-existent, or even in the opposite direction. Accordingly, a definitive low level state (i.e., "0") may be detected by the sensor 130.

Figure 4:
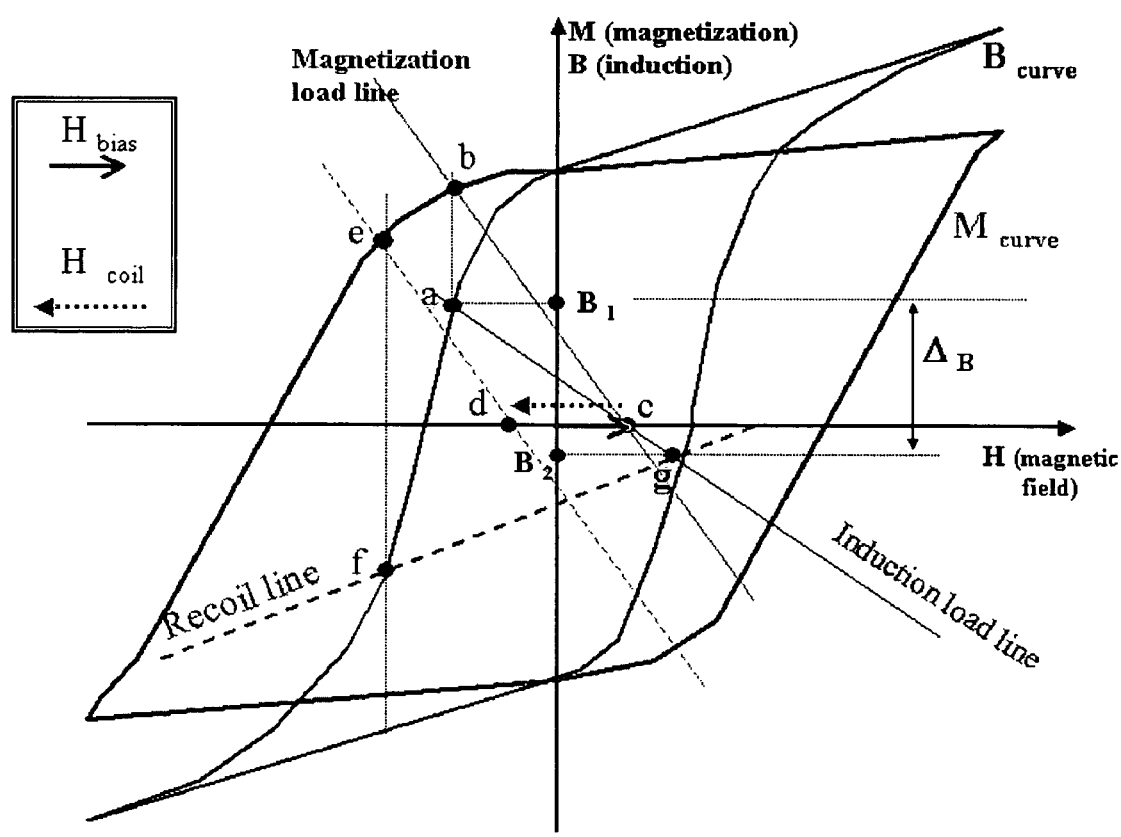
FIG. 4 shows a graph illustrating the hysteresis loop for determining the recoil magnetization of the magnetic switch of the present invention.
Figure 5A:
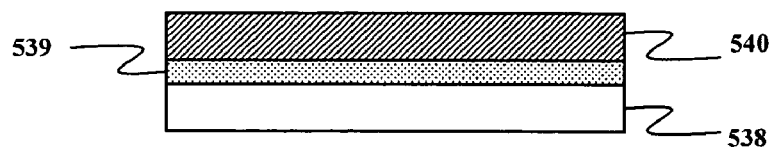
FIGS. 5A-5H show various exemplary stages of fabrication for an exemplary sensor in accordance with the present invention.
Figure 5B:
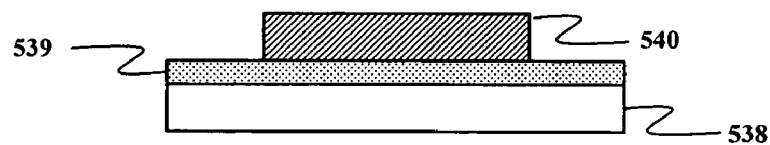
Figure 5C:
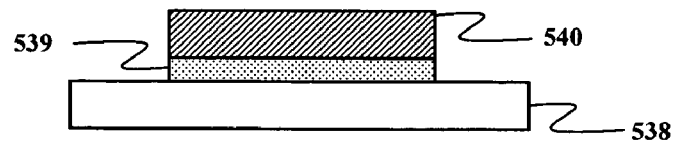
Figure 5D:
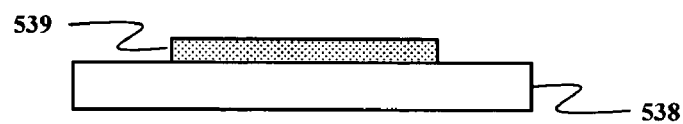
Figure 5E:
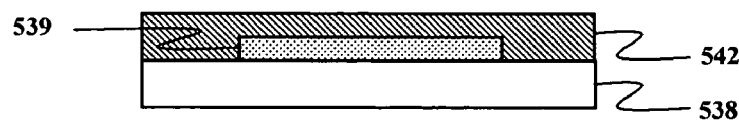
Figure 5F:
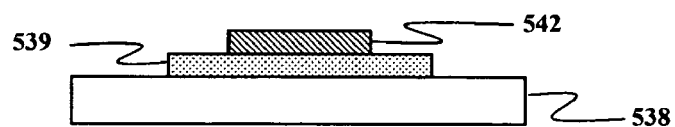
Figure 5G:
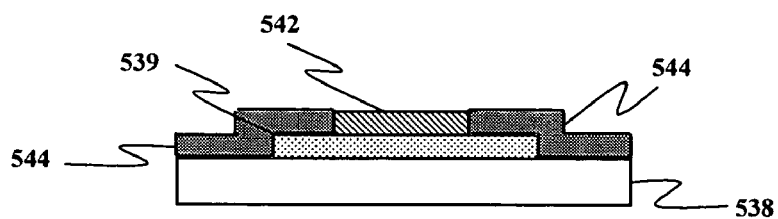
Figure 5H:
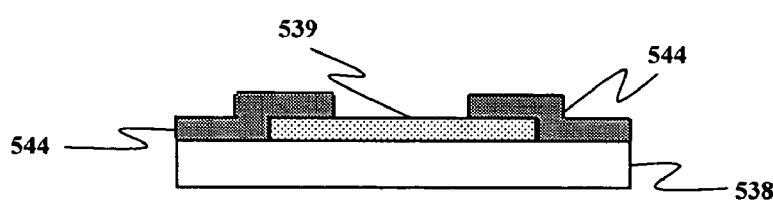

The switching behaviour shown schematically in FIGS. 3A and 3B may be explained using the hysteresis loops of the magnetic component 322 as shown in FIG. 4. First, the intersection of the induction load line and the induction hysteresis loop define a point "a" with induction $B_1$. Point "a" may then be used to determine the corresponding point "b" on the magnetization loop. The magnetization load line can then be drawn. This load line is then translated by $H_{coil}$ along the magnetic field axis to establish a new intersection at point "e" on the magnetization hysteresis loop. The corresponding point "f" on the induction loop may then be established. After $H_{coil}$ is removed (i.e., current pulse is removed), the magnetic component 322 will recoil. Using point "f" and the recoil permeability, the recoil line can then be drawn. Finally, the intersection point "g" of the recoil line and the magnetization load line can be determined, providing the induction $B_2$. Induction $B_2$ is then set as the induced magnetization (M) that is stored in magnetic component 322 once the current (I) is removed in establishing the low state (i.e., "0").

The fabrication process will now be explained with reference to FIGS. 5-10. The fabrication process of the memory cell 10 (as shown in FIG. 1) may be divided into 2 parts: (1) fabrication of the sensor 130, and (2) fabrication of the magnetic switch 120. For the tunable magnetic switch, an additional process for fabricating the bias magnet is included.

The Hall Effect sensor 132 is fabricated with high mobility materials, such as III-V materials (i.e., compounds formed from groups III and V elements of the periodic table). III-IV materials include, but are not limited to, GaAs, InAs, InSb, and related two-dimensional electron gas (2DEG) structures. A 2DEG structure based on a GaAs/AlGaAs hetero-structure may be formed at the hetero junction interface of a modulation-doped hetero-structure between a doped wide band-gap AlGaAs material (i.e., barrier) and an undoped narrow band-gap GaAs material (i.e., well). Ionized carriers (from the dopant) transfer into the well, forming the 2DEG. These carriers are spatially separated from their ionized parent impurities and, therefore, allow for high carrier mobility and a large Hall Effect. Although only III-IV materials are discussed here, other materials (e.g., silicon) may be used to fabricate the Hall Effect sensor 132.

FIGS. 5A-5D illustrate the various fabrication stages of the Hall Effect sensor 132 in accordance with an exemplary embodiment of the present invention. A suitable wafer 538, such as a semi-insulating GaAs wafer with a thin n-type active GaAs film 539 (about 0.5-0.6 µm), is used. A layer of resist 540 (e.g., 950K PMMA 4%) is spun onto the wafer 538. The following spin conditions may be used: spin rate=about 4000 rpm (thickness=0.5-2 µm); bake temperature=160° C.; soft-bake time=7 minute; exposure energy=25 kV; exposure dose=150 µC/cm$^2$; developer=MBIK/IPA mixture (1:3); development time=25 seconds. The resist layer 540 is patterned through EBL (i.e., electron beam lithography); however, any suitable patterning technique (e.g., photolithography with standard AZ resist type) may be used. A mesa etch process is then carried out for insulating the sensor. The etch process involves wet etching with, for example, a standard $H_2O_2/H_3PO_4/H_2O$ solution.

Following the etching process, the input terminals 134 and output terminals 136 (FIG. 1) are deposited through a lift-off process. As shown in FIGS. 5E-5H, the lift-off process involves spinning a layer 542 made of double layer copolymer/PMMA (at 4000 rpm). The lift-off profile (i.e., under-etching) provided by the difference of sensitivity between the copolymer and the PMMA during the development process and after the exposition to an electron beam. A contact layer 544 of suitable material, such as gold-germanium (AuGe), is evaporated onto the wafer 538 to a thickness of about 400 nm to form ohmic contacts 134 and 136 to be used as input and output terminals of sensor 130. A layer of nickel may be added to the AuGe layer 544 to improve contact performance.

Figure 6:
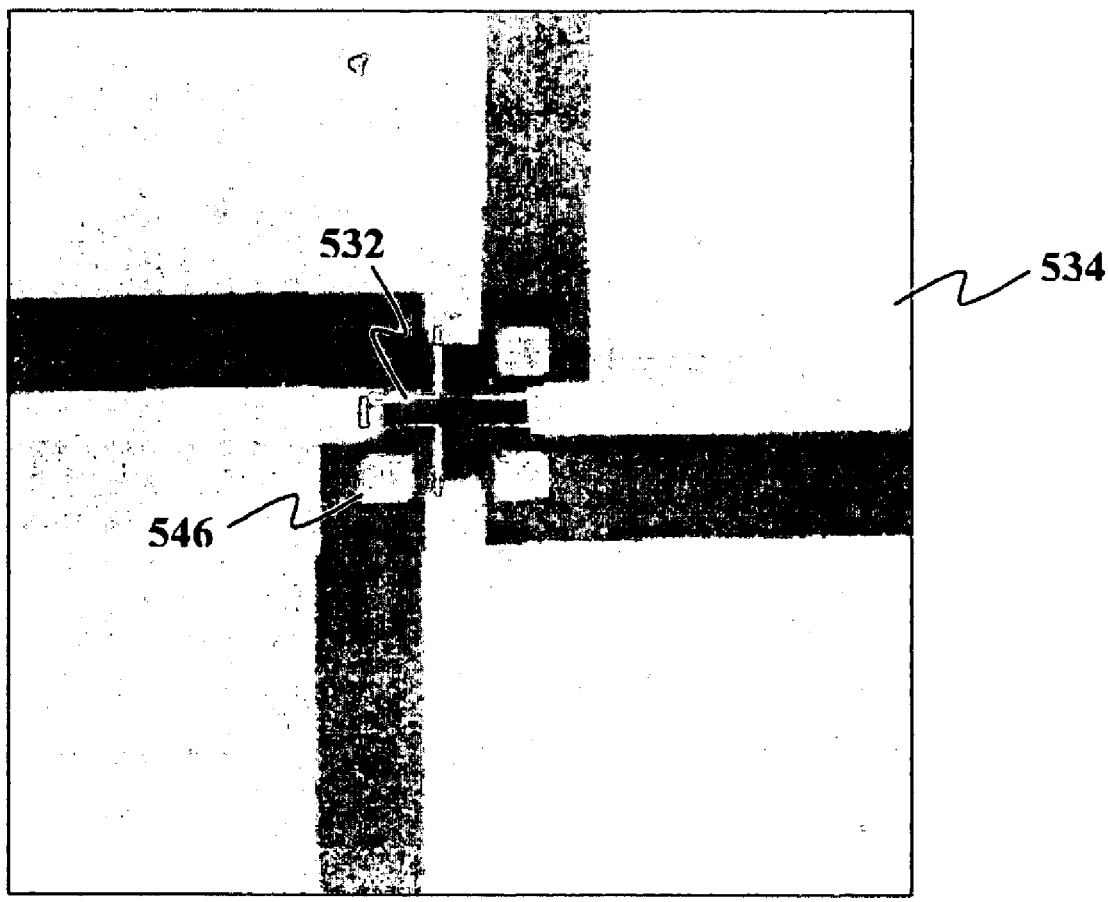
FIG. 6 shows a scanning electron microscope (SEM) image of a fabricated exemplary sensor in accordance with the present invention.
Figure 7A:
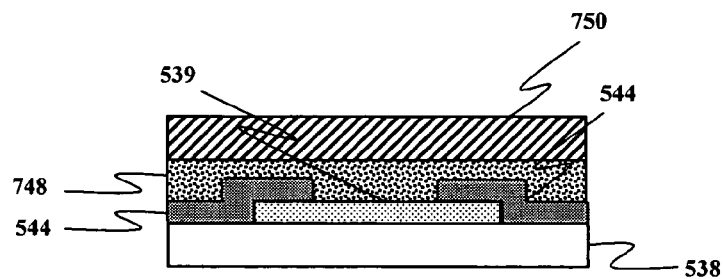
FIGS. 7A-7D show various exemplary stages of fabrication for insulating an exemplary sensor in accordance with the present invention.
Figure 7B:
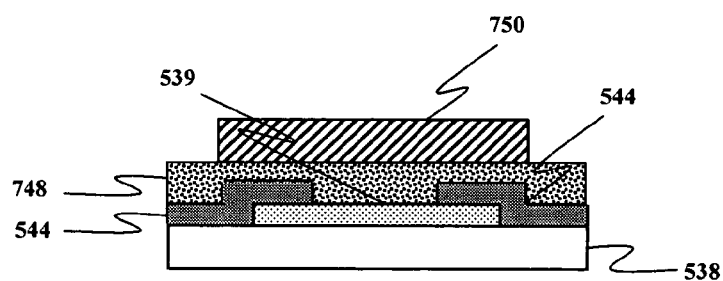
Figure 7C:
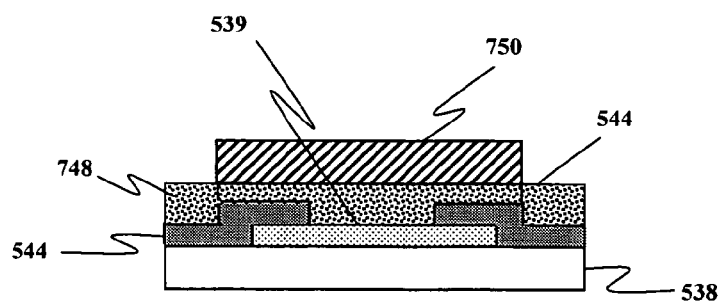
Figure 7D:
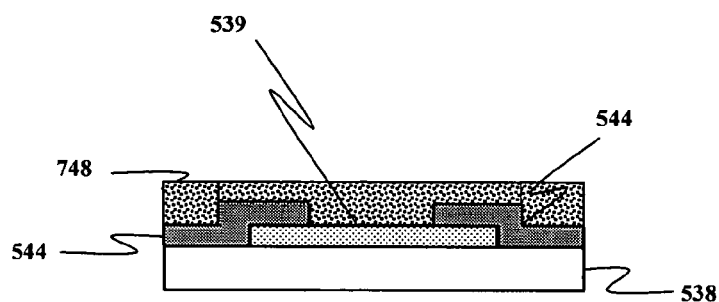

Following the evaporation step, the lift-off process is completed by placing the wafer 538 in acetone in order to remove any unnecessary portions of the AuGe layer 544. After appropriate cleaning, the contacts (i.e., AuGe layer 544) undergo rapid thermal annealing (RTA). The annealing is carried out at about 340° C. for about 40 seconds in an RTA chamber filled in nitrogen ($N_2$) flow. The lift-off process is completed by placing the wafer 538 in acetone in order to remove any unnecessary portions of the AuGe layer 544. FIG. 6 illustrates the GaAs Greek cross Hall Effect sensor with AuGe contacts. Also shown are alignment marks 546 included in the pattern.

Although the resist PMMA 4% is used in the example above, any suitable resist, such as PMMA 2% may be used. Moreover, HMDS, an adhesion promoter, may be used as needed. When using PMMA 2% as the resist, the following lithography processing parameters may be used: PMMA (2%); exposure energy=15 kV; exposure dose=150 µC/cm$^2$; developer=MBIK/IPA mixture (1:3); development time=25 seconds.

Once the Hall Effect sensor 132 is fabricated, an insulating layer 748 is spun onto the Hall Effect sensor 532. The insulating layer 748 is made of a suitable material, such as a dielectric polyimide, which may be processed as typical resists (i.e., spun onto a wafer and baked in an oven or on a hot plate). An example of a dielectric polyimide is HD Microsystem's PI2545 (an inter-metallic, high-temperature polyimide used in various microelectronic applications). It has a high glass transition temperature (i.e., about 400° C.) and may be patterned with positive resist. Moreover, the cured film is ductile and flexible with a low CTE, and is resistant to common wet and dry processing chemicals. Other suitable materials include silicon oxide and silicon nitride, which may be deposited through Plasma Enhanced Chemical Vapor Deposition (PECVD) at low temperatures.

For illustrative purposes only, FIGS. 7A-7D show an insulating layer 748 of PI2545 spun onto the Hall Effect sensor 532 at a rate of about 6000 rpm and then soft-baked on a hot plate. The temperature is ramped from 25° C. to 170° C. at 240° C./h. Once an oven or hot plate temperature of 170° C. is reached, the temperature is kept constant for 9 minutes (i.e., soak period). After the soak period, the hot plate cools down to room temperature by natural convection. When the insulating layer 748 is baked at an oven or hotplate temperature of about 140° C. or 170° C., it develops a good chemical resistance to boiling acetone, which is later used to remove a resist layer.

Once the insulating layer 748 is deposited, a positive resist layer 750 (e.g., PMMA 4% or AZ5206) is spun onto the insulating layer 748. For purposes of explanation, PMMA 4% is used. The resist layer 750 is then baked in an oven or hot plate at a temperature of 160° C. for two (2) minutes, with a ramp rate of 6° C./minute and a soak period of 6 minutes. A baking temperature of 160° C. is the minimum safe bake temperature for PMMA (e.g., PMMA baked at 120° C. may exhibit some adhesion failure).

Then, the wafer is placed into an EBL chamber, where it is exposed to 25 kV of electron beam. The resist layer 750 is patterned in such a way as to make openings over the Hall Effect sensor's ohmic contacts and alignment marks (if any). For a pattern of the size 9×10 μm$^2$, an appropriate dose may be in the range of 165-182 μC/cm$^2$; for a pattern of the size 17×17 μm$^2$, an appropriate dose may be in the range of 149-163 μC/cm$^2$; and for a pattern of the size 100×112 μm$^2$, an appropriate dose may be in the range of 132-145 μC/cm$^2$.

After exposure, the resist layer 750 is developed in a suitable solution, such as MIBK/alcohol (1:3), for a suitable amount of time (e.g., about 40-55 seconds). The wafer is then rinsed in alcohol and de-ionized water. Once the wafer is cleaned, a diluted PPD450 (1:5) solution is used for etching the insulating layer for a suitable amount of time (e.g., about 6-14 minutes or even longer). The degrees of dilution and agitation and the development and etching times may be changed as needed. Boiling acetone is used to remove the resist layer 750 (i.e., PMMA). Finally, to complete fabrication of the insulating layer 748, the insulating layer 748 is hard-baked at about 200° C. using a temperature ramp as described above. The insulating layer may be hard-baked at a temperature as high as 400° C. However, such high temperature may create unwanted diffusion in the Hall Effect sensor.

Once the sensor 130 is fabricated, the magnetic switch 120 is fabricated over the insulating layer 748. The general approach to fabricating the magnetic switch 120 is to first fabricate the coil 124, and then to fabricate the magnetic component 122. Traditional methods for fabricating magnetic materials (e.g., Alnico and Martensitic steel) involve synthesis routes that include, for example, melting different components, casting, and high temperature (typically, above 800° C.) thermal processing (e.g., quenching). Other synthesis routes include sintering and extrusion. These methods are incompatible with micro-technology or wafer-scale processing due to the extremely small sizes of the components.

Electroplating, on the other hand, allows for relatively good definition of element shapes with fewer defects on element walls. It is also an inexpensive and relatively simple process to implement. Three-electrode systems can be used to monitor the stoichiometry of deposited alloys.

Figure 8:
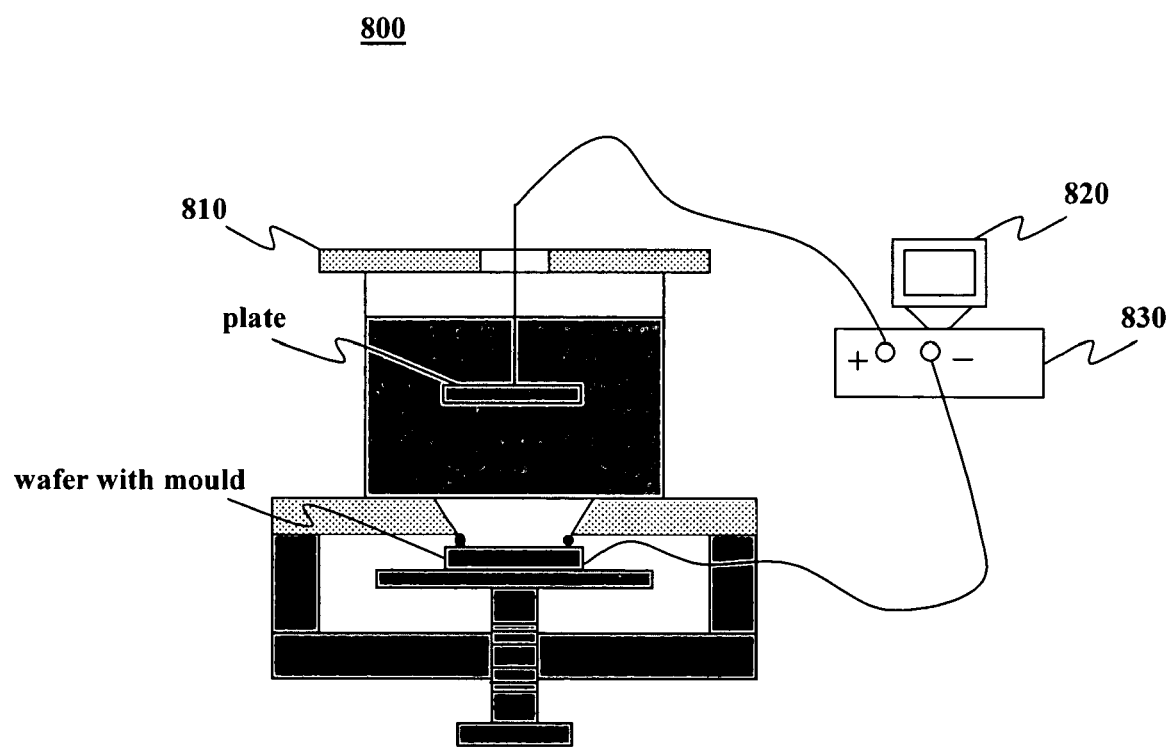
FIG. 8 shows an exemplary embodiment of an electroplating system in accordance with the present invention.
Figure 9A:
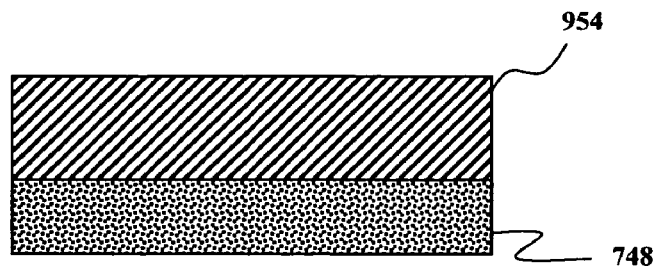
FIGS. 9A-9D show various exemplary stages of a fabrication process (i.e., lift-off) for an exemplary coil and magnet spot in accordance with the present invention.
Figure 9B:
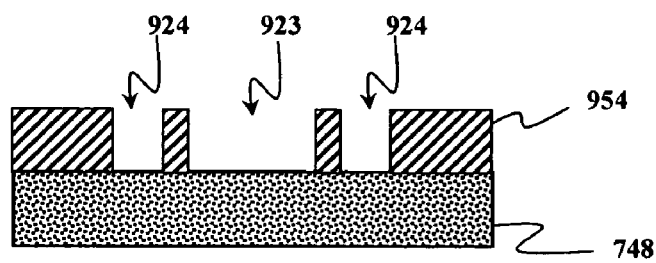
Figure 9C:
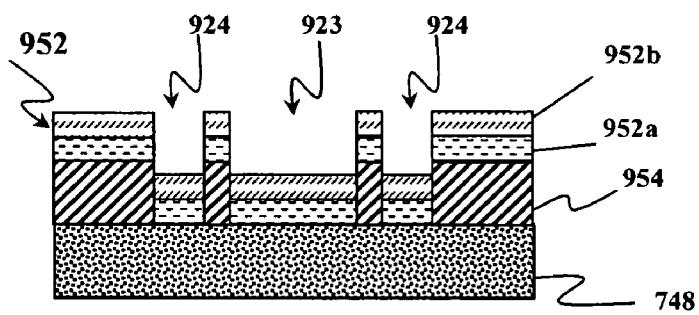
Figure 9D:
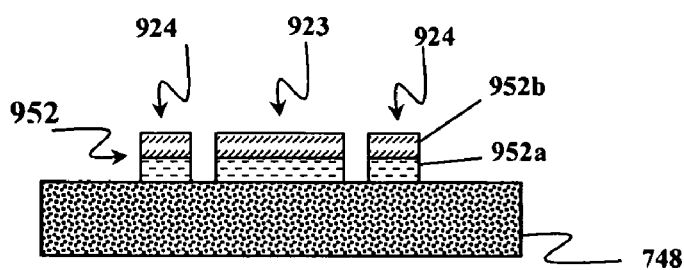
Figure 9E:
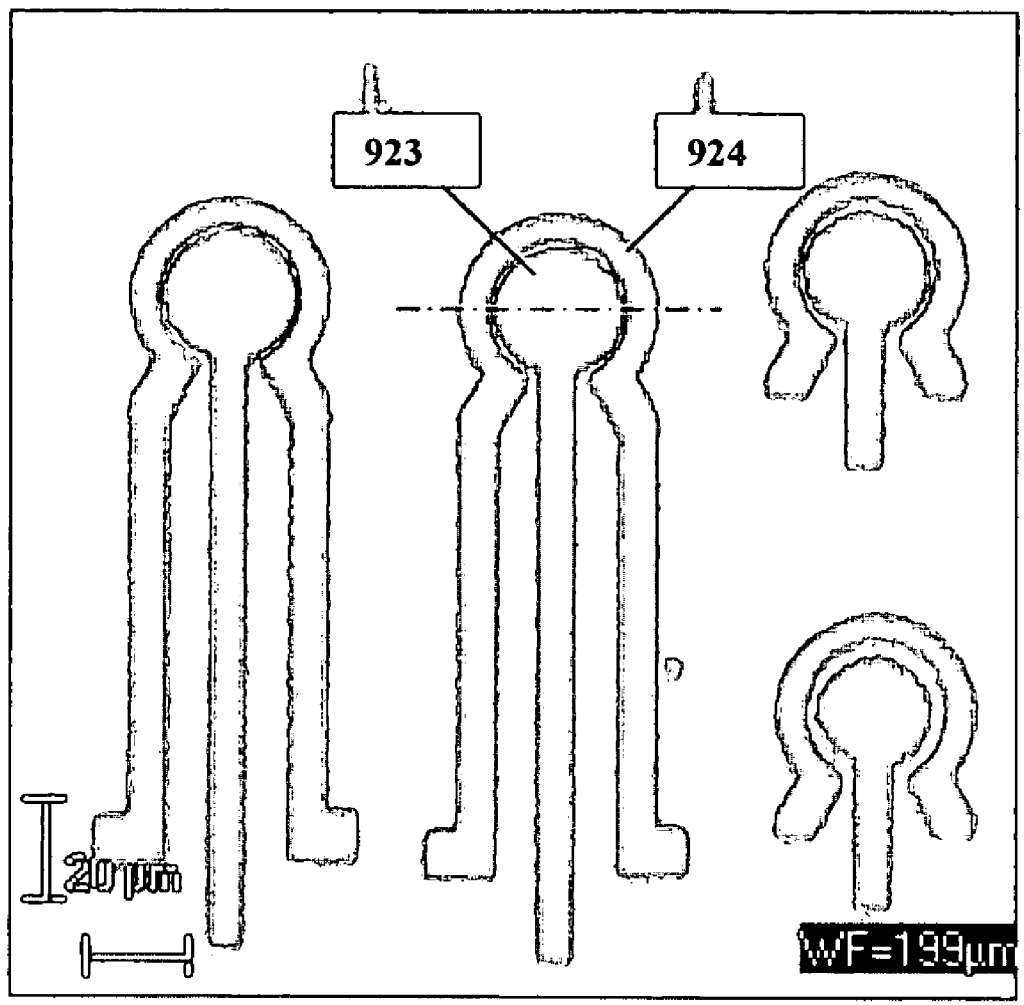
FIG. 9E shows an SEM image of a fabricated exemplary sensor in accordance with the fabrication process of the present invention.

Electroplating will be used in explaining the fabrication process of the magnetic switch 120; however, any suitable synthesis route may be utilized. As shown in FIG. 8, an electroplating system 800 includes an electroplating cell 810, a computer 820, and a computer-driven potentiostat/galvanostat 830. The computer 820 is connected to electroplating cell 810 through the potentiostat/galvanostat 830 to control the electroplating process. The potentiostat/galvanostat 830 can function as either a potentiostat or a galvanostat.

First, the coil and a magnet spot or area within the coil where the magnetic component is to be deposited are formed over the sensor 130. A first exemplary process for forming the coil and the magnet spot involves a titanium/gold lift-off process. FIGS. 9A-9D illustrate various stages of fabrication of according to the gold lift-off process according to the present invention.

The insulating layer 748 (from FIG. 7D) is first covered with a double resist layer 954 (e.g., copolymer/PMMA). For that, a layer of the copolymer E11 is first spun onto the wafer. Then, the copolymer layer is baked at 160° C. for 5 minutes on a hot plate with a temperature ramp as described above. The hot plate is left to cool to room temperature by natural convection. Then, a layer of PMMA 4% in anisole is spun onto the wafer and baked at 160° C. for 5 minutes using the defined temperature ramp. The hot plate again is left to cool to room temperature by natural convection.

The wafer is placed into the EBL chamber, where the double resist layer 954 is exposed to an electron beam so as to pattern the coil 924 and magnet spot 923, with an exposure of 25 kV and various doses: for a fine coil pattern, an appropriate dose is 150 μC/cm$^2$; for the magnet spot, an appropriate dose is 120 μC/cm$^2$; for alignment marks (if any), an appropriate dose is 195 μC/cm$^2$. The alignment marks can be included in the pattern to aid in the location of the magnet spot. The double resist layer 954 is then developed into a suitable solution, such as MIBK/alcohol, for about twenty (20) seconds.

After the patterning step, the wafer is placed into an electron beam evaporator, where titanium layer 952a and gold layer 952b of 25 nm and 150 nm, respectively, are deposited onto the patterns to form the Ti/Au layer 952. Titanium layer 952a is used as an adhesion layer. Finally, the wafer is removed from the evaporator and dipped into acetone for about one hour to remove the double resist layer 954 and any unwanted Ti/Au layers 952. As shown in FIG. 9F, the coil 924 and magnet spot 923 are obtained. In this exemplary embodiment, only a single turn coil 924 is used. However, different number of turns may be used as appropriate without departing from the scope of the invention.

Figure 10A:
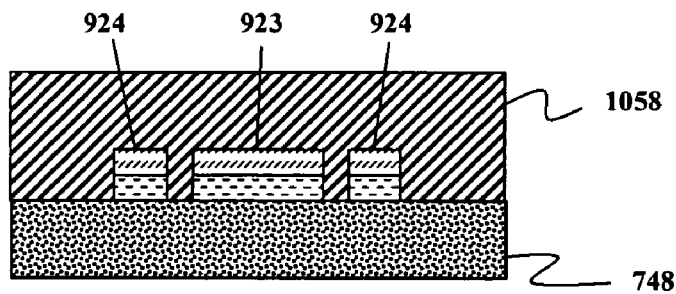
FIGS. 10A-10D show various exemplary stages of fabrication for depositing a magnetic material on a magnet spot in accordance with the present invention.
Figure 10B:
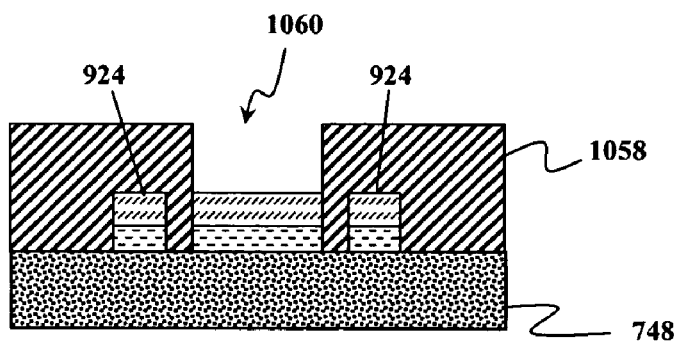
Figure 10C:
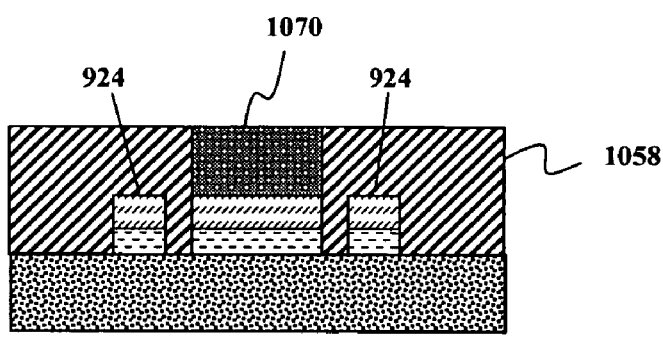
Figure 10D:
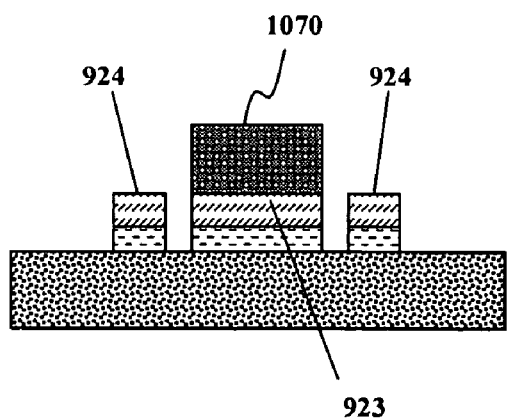

After depositing the coil 924, magnet spot 923, and alignment marks (not shown), the magnetic component 122 is electroplated onto the magnet spot 923 through a mold that provides the shape and dimensions of the magnetic component 122. As shown in FIGS. 10A-10C, to fabricate such mold, EBL is used to pattern a thick (e.g., about 10 μm) layer 1058 of resist (e.g., AZ4620) onto the coil 924, magnet spot 923, and alignment marks (not shown). The resist layer 1058 is baked at about 95° C. for about 4 minutes. Then, the resist layer 1058 is placed into a chamber for EBL, where the areas where the alignment marks are located are exposed to an electron beam. Following this exposure, the resist layer 1058 is developed in a suitable solution, such as PPD450, and removed from the areas where the alignment marks are located. The wafer is cleaned with de-ionized water and blown dry with $N_2$. Then, using EBL (and the alignment marks as a guide), the magnet spot 923 is patterned and the resist layer 1058 is developed for a second time in order to obtain a well 1060. Well 1060 functions as a container into which a magnetic material is electroplated to form the magnetic component.

The wafer with the resist template is then placed into an electroplating cell 810 (FIG. 8), where pulsed deposition (with, e.g., a 2% duty cycle, where $t_{on}$=1 ms; $t_{off}$=49 ms; and the peak current is about 1.4 mA) is used to deposit magnetic material 1070 (e.g., nickel or nickel-iron) onto the resist template forming the well on the magnetic spot to thereby form an array of magnetic components 122. Pure materials are generally easier to deposit. However, alloys may also be used. Examples of materials that can be deposited include cobalt, iron, nickel, nickel-iron (NiFe), and cobalt-nickel-iron (CoNiFe). Different catalysts may be used to increase the coercivity of these materials if needed.

Figure 11:
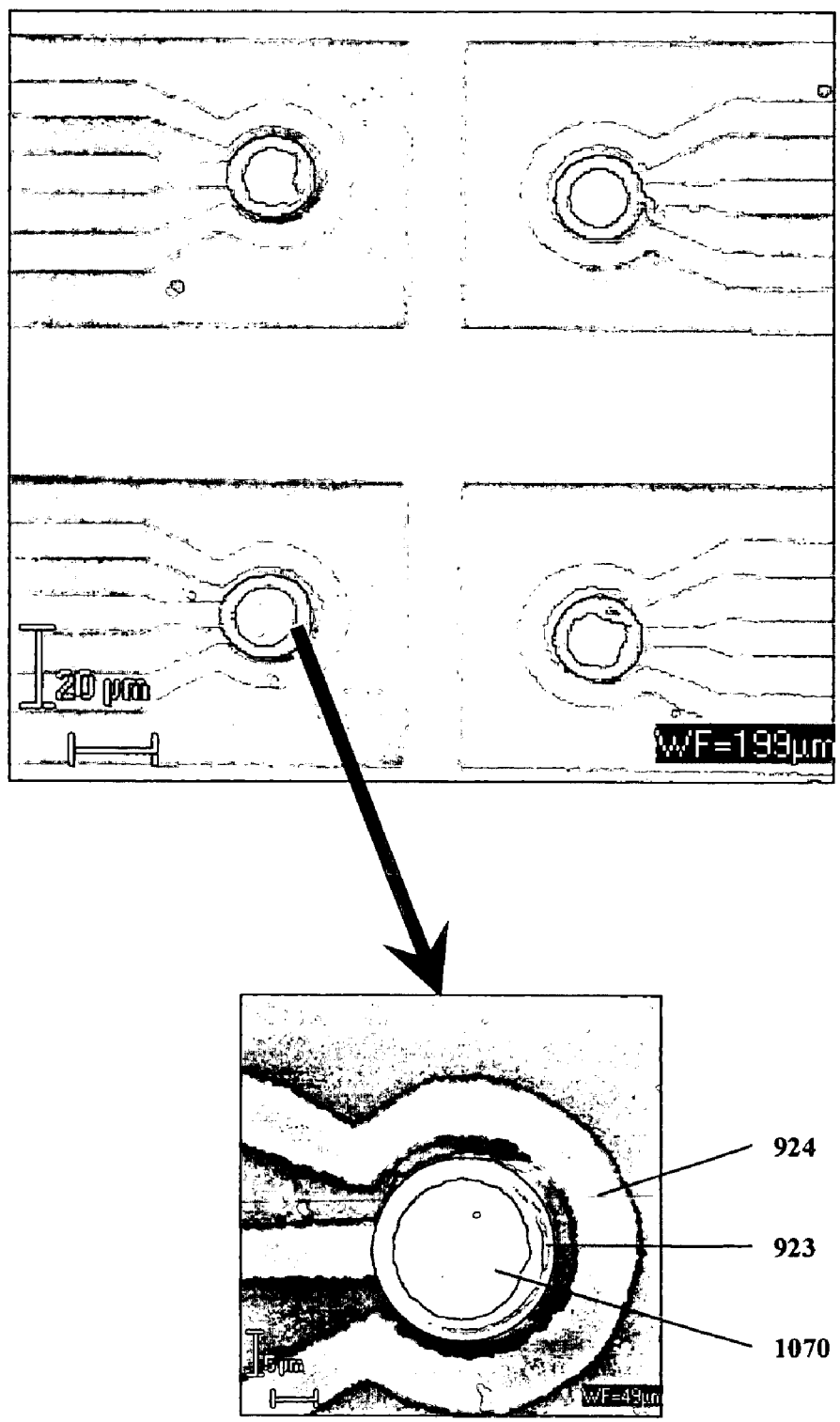
FIG. 11 shows an SEM image of a fabricated magnetic switch in accordance with the present invention.
Figure 12A:
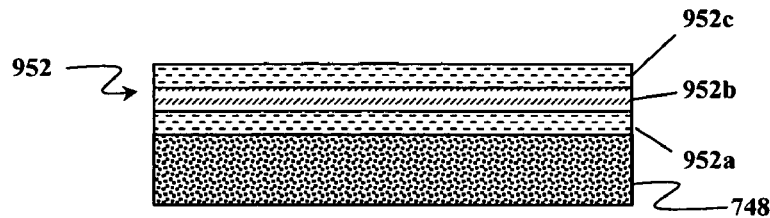
FIGS. 12A-12E show various exemplary stages of an alternative fabrication process (i.e., direct etching) for an exemplary coil and magnet spot in accordance with the present invention.
Figure 12B:
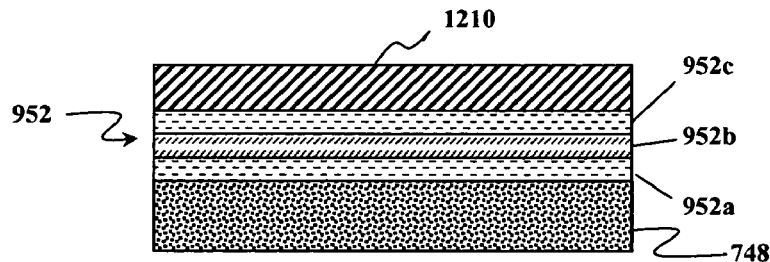
Figure 12C:
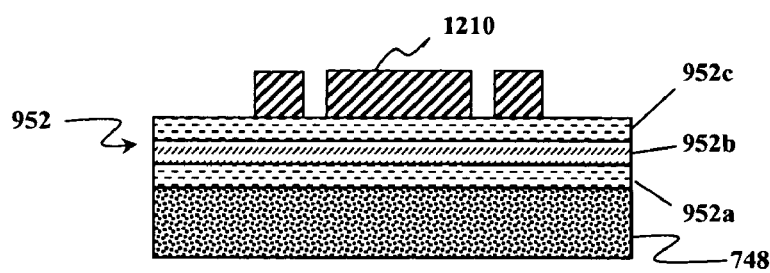
Figure 12D:
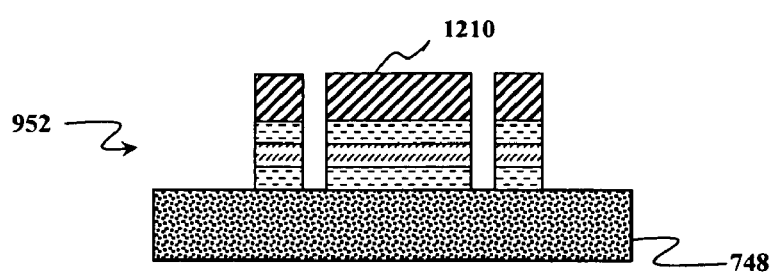
Figure 12E:
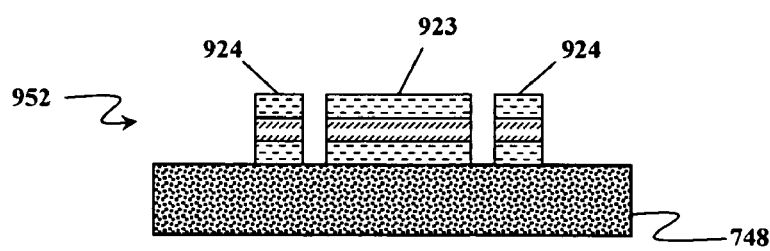
Figure 12F:
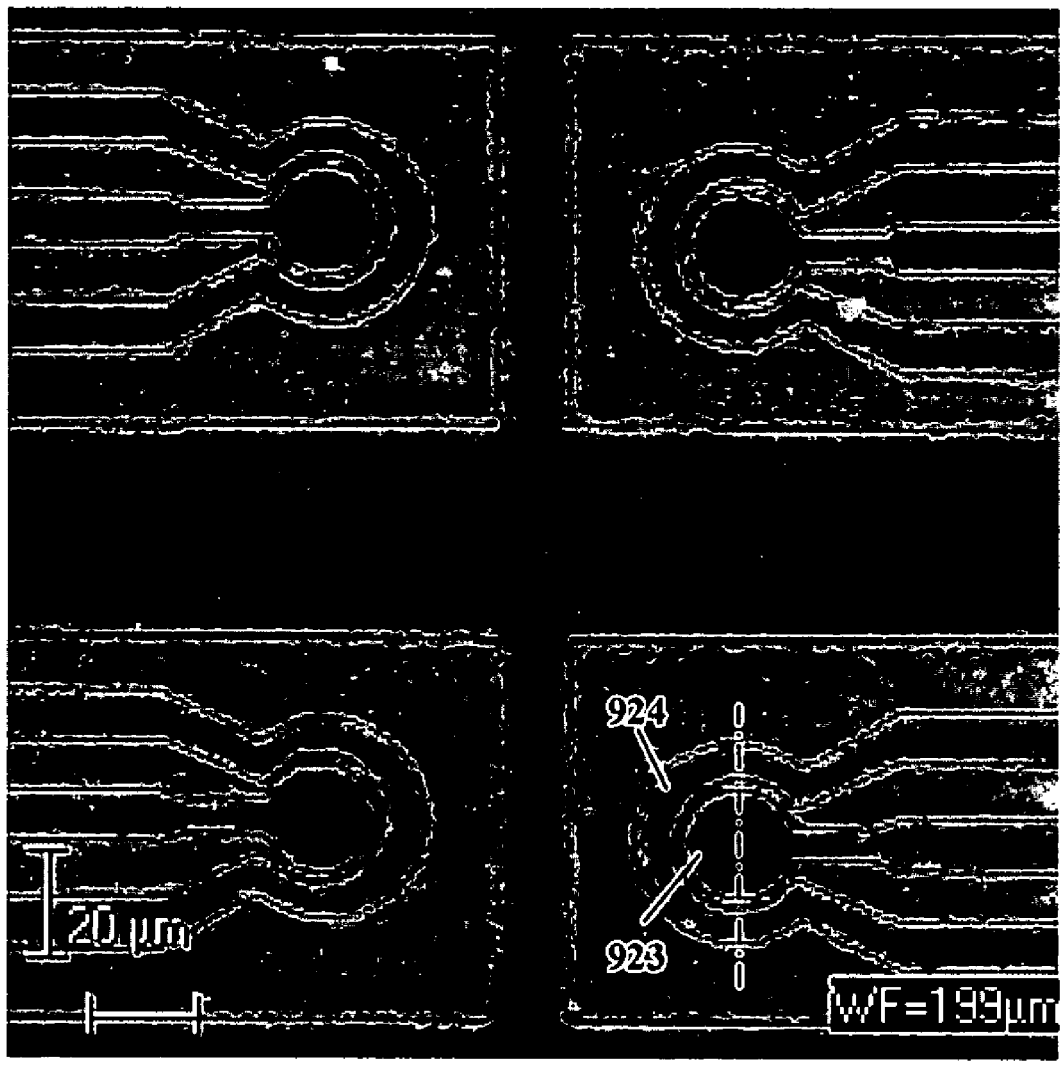
FIG. 12F shows an SEM image of a fabricated exemplary sensor in accordance with the alternate fabricating process of the present invention.

For illustrative purposes, a nickel chloride based solution with two additives, namely saccharin (which acts as a strain relief agent) and sodium lauryl sulfate (which acts as a surfactant), is deposited into the well 1060. A current, such as a DC current, is used to fabricate the magnet component. For an even smaller, higher aspect ratio structure, pulsed electro-deposition (with, e.g., a 2% duty cycle) may be used to deposit magnetic material (e.g., nickel or nickel-iron) onto the resist template to form an array of magnetic component 122. The electroplating conditions are controlled by the computer-driven potentiostat/galvanostat 830. Although the shape of the magnet is cylindrical, any shape (e.g., rectangle, square) may be developed using the above technique. After electro-deposition, the mold (i.e., thick resist layer 1058) is removed using a suitable solution, such as acetone. FIG. 11 shows a magnetic switch developed using the above process.

Once magnetic switch 120 has been completed, further processing steps may be implemented to fabricate the tunable magnetic switch as shown in FIGS. 3A and 3B. For instance, an insulating layer 748 is deposited on the top of the magnetic switch 120. Then, a hard permanent magnet, for example, is added on the top of the structure by hybrid integration of prefabricated micro-magnets or by electroplating hard ferromagnetic material, such as cobalt or selected alloys, on the insulating layer 748.

Although EBL is used as the exemplary method for fabricating the mold, any suitable method, such as photolithography, may be used. For example, when using photolithography, the mold is formed by exposing the resist layer (i.e., AZ4620) to UV light through a suitable prefabricated hard mask.

Another approach to fabricating the coil 924 and magnet spot 923 involves etching directly the seed layer 952 so as to obtain the coil 924 and the magnet spot 923 in the same process step as shown in FIG. 12A-12E. A key concept is to use the seed layer 925 for the growth of the magnetic component 122 and, at the same time, for making the coil 924. First, the wafer carrying the seed layer 952 (i.e., Ti layer 952a, Cu layer 952b, Ti layer 952c) is patterned through, for example, EBL. This patterning step can incorporate the use of a positive resist layer 1210 and wet etching. Again, the pattern includes a single loop coil around a central metallic spot, with a metallic path linking it electrically to a common electrode used for electroplating. However, any suitable number of turns may be used.

The wafer is dried by baking it on a hot plate for about 30 minutes at about 150° C. A layer of resist 1210 (e.g., AZ5206E) is spun onto the wafer. The resist layer 1210 is soft-baked, starting from about 95° C. and then lowered to about 80° C., the change in temperature time being about six (6) to seven (7) minutes. The resist layer 1210 is then exposed (e.g., exposure energy=about 10 kV; dose=about 6 $\mu C/cm^2$). After exposure, the wafer is developed in a suitable solution, such as PPD450. The wafer is then cleaned with de-ionized water. After the cleaning step, the wafer is hard-baked for about 10 minutes at about 125° C. The titanium (Ti) and copper (Cu) layers are etched with suitable solutions. For example, the Ti layers 952a and 952c may be etched with a highly diluted $HF/HNO_3/H_2O$ solution, while the copper layer 952b may be etched with a $HCl/H_2O_2/H_2O$ solution. The wafer is then cleaned to remove resist 1210. The cleaning step can include, for example, boiling acetone, boiling alcohol, and de-ionized water rinsing. Once the coil 924 and magnet spot 923 have been etched directly into the seed layer 952, the wafer undergoes the process for creating the mold for electroplating the magnetic component as described above.

The magnetic memory device according to the present invention was described in relation to a magnetic switch over a Hall Effect sensor. In particular, the advantages of a magnetic component that can retain a magnetic field without any power supplied thereto and a simple sensor for reading the stored magnetic field provides a non-volatile memory device that consumes very little power for operation compared to the electric-based memory devices currently in use.

Additionally, the tunable magnetic switch according to the present invention was described. The advantages of the tunable magnetic switch according to the present invention are numerous. First, because the magnetic component retains the induced magnetization (M) from the induction coil, the tunable magnetic switch according to the present invention can function as a switch with non-volatile memory.

Second, the tunable magnetic switch according to the present invention provides a sufficiently high field for the Hall Effect sensor so as to partially or even completely compensate for the sensor offset. In the case of the former, the tunability of the magnetic switch according to the present invention, i.e., the bias field may be adjusted relative to the sensor offset, allows for a larger tolerance of fabrication constraints, makes fabrication much easier, and increases reliability of the devices. This is a considerable asset for miniaturization as the sensor offset increases as size of the devices are scaled downward.

Yet another significant advantage of this approach is that the tunable magnetic switch according to the present invention allows usage of low aspect ratio magnets, which are much easier to fabricate, since the bias field compensates for the demagnetization of the magnetic component of the memory cell. The tunable magnetic switch according to the present invention was described in relation to a magnetic memory device using Hall Effect sensors. However, the tunable magnetic switch according to the present invention may be applied with other magnetic memory devices as the bias magnetic field used for tuning the magnetic switch may be applied to any magnetic component and sensor configuration.

The magnetic memory device according to the present invention has various applications including, but not limited to, radio frequency identification tags (RFIDs), personal digital assistants (PDAs), cellular phones, and other computing devices. For instance, the magnetic memory device according to the present invention has uses for aerospace/defense, sensors, and RFID applications. The magnetic random access memory of the present invention has been developed for low density radiation hard applications. The magnetic random access memory of the present invention is non-volatile, read/write addressable, and fabricated from radiation hard materials. The applicable and emerging markets include aerospace and defense, such as rad-hard military and radar systems, satellite, and security applications, sensors, and RFID. Sensors in automotive applications, medial equipment like bio-electronics, biosensors, and gas/liquid/energy metering, and seismic monitoring for oil and gas exploration, for example, are all envisioned as potential uses for the present invention. Future growth and technical evolution is anticipated in the pervasive computing, PDA, and display markets as well.

In an exemplary embodiment, the magnetic memory devices in accordance with the present invention are adapted to be used with sensors in harsh environments, such as down holes in an oil field. For example, a magnetic memory device in accordance with the present invention may be used in environments having temperature ranges around 175-220° C., pressures up to 20,000 psi, and extreme g-force conditions. Accordingly, a magnetic memory device having a hall effect sensing device in accordance with the present invention coupled to an environmental and/or chemical sensor may be used to sense down hole conditions in drilling fluid and other environmental conditions. The sensed chemical/environmental data may be stored in the magnetic memory device of the present invention with the assurance that the data will not be corrupted due to environmental factors that may affect the memory device.

Figure 13:
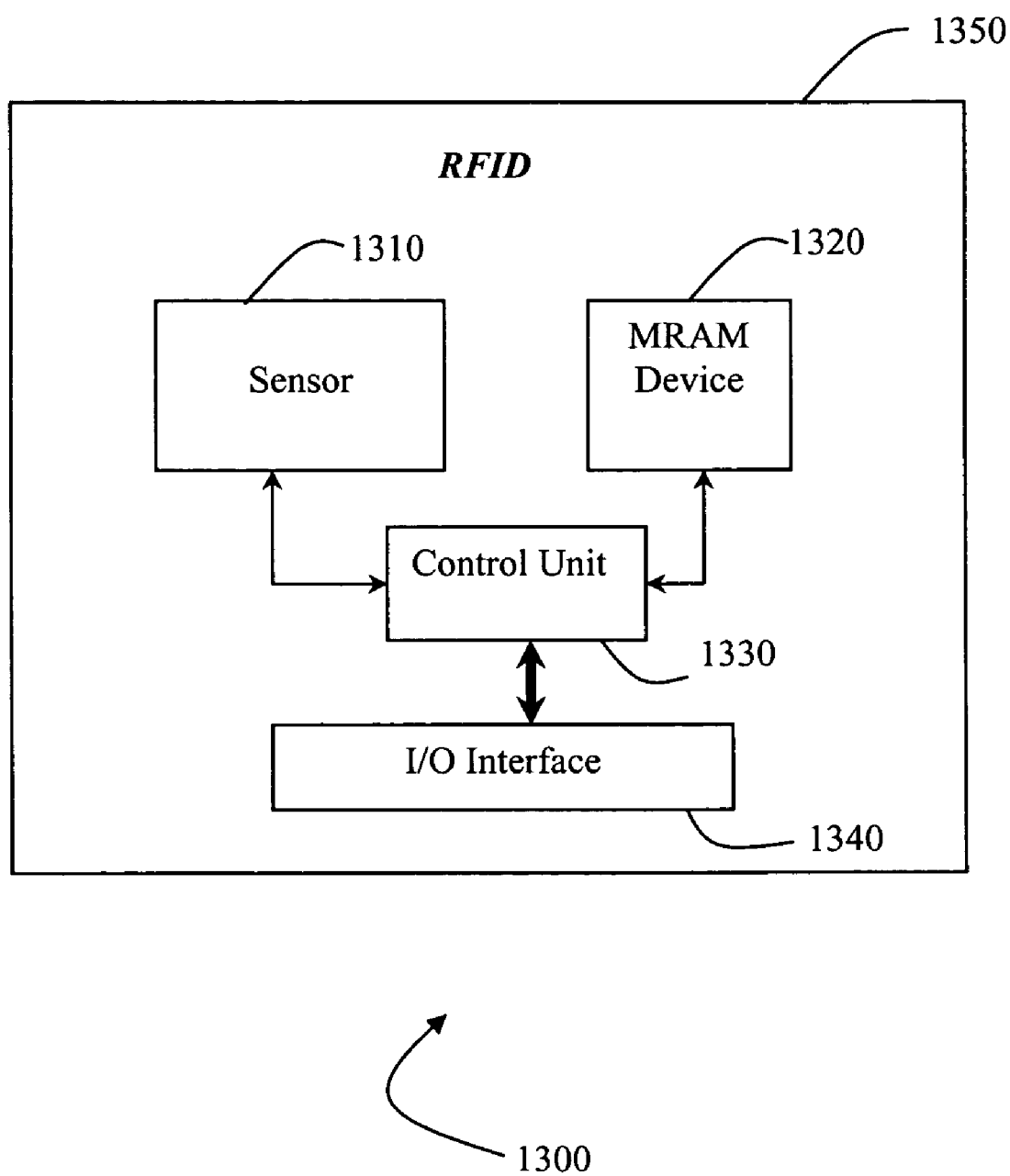
FIG. 13 shows a block diagram of an exemplary sensor in accordance with the present invention.

FIG. 13 shows an exemplary sensor coupled to a modified form of the memory device of the present invention and integrated onto, for example, an RFID tag representing in combination a proprietary device for remote sensing of down hole conditions in an oil well, for example. However, other sensor/RFID applications may be applied without departing from the scope of the present invention. In particular, as shown in FIG. 3, an exemplary sensor module 1300 includes a sensor 1310 and a magnetic memory device 1320 in accordance with the present invention. Data collected by the sensor 1310 is communicated to the magnetic memory device 1320 via a control unit 1330 for storage. The control unit 1330 provides the necessary control signals and power to the sensor 1310 and the magnetic memory device 1320. An input/output (I/O) interface 1340 provides a communication channel to be coupled to an external device, such as a computer (not shown), to access the sensor data stored in the magnetic memory device 1320. Data may be read from, or stored to the magnetic memory device 1320 through the I/O interface 1340. In the exemplary embodiment of FIG. 13, the components of the sensor module 1300 are integrated onto an RFID platform 1350. However, sensor module 1300 may also be scaled down on a single chip integrated circuit (IC) or scaled up onto a printed circuit board (PCB), for example, as dictated by the application in which the sensor module 1300 is to used. Because the magnetic memory device 1320 in accordance with the present invention may be scaled down as described above, various platforms for the sensor module 1300 may be used without departing from the scope of the present invention.

It will be apparent to those skilled in the art that various modifications and variations can be made in the tunable magnetic switch of the present invention without departing from the spirit or scope of the invention. Thus, it is intended that the present invention cover the modifications and variations of this invention provided they come within the scope of the appended claims and their equivalents.

What is claimed is:
1. A sensing device, comprising:
   a sensor;
   a control unit;
   an input/output (I/O) interface; and
   a non-volatile magnetic memory device having one or more memory cells, wherein each memory cell of the non-volatile magnetic memory device includes
   a tunable magnetic switch including a magnetic component, a write coil located proximate the magnetic component and a magnetic source to provide an external magnetic bias field, wherein the write coil coupled to receive a current sufficient to create a remnant magnetic polarity in the magnetic component, and wherein the magnetic switch is exposed to the external magnetic bias field; and
   a Hall sensor, positioned proximate the magnetic component, to detect the remnant magnetic polarity indicative of a stored data bit.

2. The device of claim 1, wherein the magnetic component is one of a permanent and ferromagnetic material.

3. The device of claim 2, wherein the magnetic component is made of nickel or nickel-iron alloy.

4. The device of claim 1, wherein the write coil is a single-turn coil.

5. The device of claim 4, wherein the write coil is made of one of a combination of titanium and gold, and a combination of titanium and copper.

6. The device of claim 4, wherein the magnetic component is coaxial with the write coil.

7. The device of claim 1, wherein the Hall sensor is a Greek cross shaped Hall sensor.

8. The device of claim 7, wherein the Hall sensor includes:
   a detecting portion having a current flow direction responsive to the remnant magnetic polarity of the magnetic component;
   an input line, coupled to the detecting portion, to feed current to the detecting portion;
   an output line, coupled to the detecting portion, to receive current from the detecting portion; and
   a collector, coupled to both the output line and the detecting portion, along a side of the detecting portion between the output line and the input line, to collect current from the detecting portion and to conduct the current into the output line to indicate a value of the stored data bit.

9. The device of claim 1, wherein the sensor, the control unit, the I/O interface, and the non-volatile magnetic memory device are integrated on a radio frequency identification (RFID) device.

10. The device of claim 1, wherein the magnetic source is one of a permanent and ferromagnetic material.

* * * * *